(12) United States Patent
Adachi (10) Patent No.: US 9,275,575 B2
(45) Date of Patent: Mar. 1, 2016

(54) DISPLAY DEVICE

(71) Applicant: Japan Display Inc., Tokyo (JP)

(72) Inventor: Masaya Adachi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/532,053

(22) Filed: Nov. 4, 2014

(65) Prior Publication Data

US 2015/0123885 A1    May 7, 2015

(30) Foreign Application Priority Data

Nov. 6, 2013    (JP) .................................. 2013-230510

(51) Int. Cl.
*G09G 3/00* (2006.01)
*G09G 3/32* (2006.01)
*G09G 3/34* (2006.01)

(52) U.S. Cl.
CPC ............ *G09G 3/3208* (2013.01); *G09G 3/3433* (2013.01)

(58) Field of Classification Search
CPC ... G09G 3/32; G09G 3/34; G09G 2320/0666; G09G 3/3406; G09G 2300/0452; G09G 2360/145; G09G 3/3208; H01J 1/62
See application file for complete search history.

(56) References Cited

U.S. PATENT DOCUMENTS 7,511,420 B2 * 3/2009 Adachi ............... H01L 27/3244
                                                                    313/498
8,274,218 B1    9/2012 Adachi et al.

FOREIGN PATENT DOCUMENTS

JP         2005-031251 A      2/2005

* cited by examiner

*Primary Examiner* — Michael Faragalla
(74) *Attorney, Agent, or Firm* — TYPHA IP LLC (57) ABSTRACT

When a previously existing technique is applied to a white OLED, such a structure is adopted that the peak wavelength of the intensity of interference is the emission peak wavelength corresponding to blue or less. However, in this case, the intensity of interference of the wavelength range corresponding to red is reduced to decrease the light emission intensity of red. A display device is configured in which a stacked film configuring a white light emitting element (an organic light-emitting diode element) is configured in such a manner that the peak wavelength of the intensity of interference is the peak wavelength of the light emission intensity corresponding to blue or less. The light emission intensity of the light emitting element corresponding to a red pixel is made greater than the light emission intensity of the light emitting elements corresponding to pixels for other colors.

15 Claims, 9 Drawing Sheets

DISPLAY DEVICE

CLAIM OF PRIORITY

The present application claims priority from Japanese Patent Application JP2013-230510 filed on Nov. 6, 2013, the content of which is hereby incorporated by reference into this application.

BACKGROUND

The present disclosure relates to a display device, and is applicable to a display device including a white organic light-emitting diode element, for example.

The organic light-emitting diode (OLED) element is an element that injects positive and negative electric charges into a light emitting layer formed of an organic thin film and converts electric energy into optical energy for emitting light. Since a luminous display device including an organic light-emitting diode element as a light emitting element (in the following, referred to as "an OLED display") is a self-luminous type, which is different from a non-luminous display device typified by a liquid crystal display device, an auxiliary light source such as a backlight is unnecessary, and the OLED display is reduced in the thickness and in the weight. Moreover, the OLED display has characteristics including a wide viewing angle and a quick display response speed.

Since the OLED has a structure in which thin films of the order of an optical wavelength or less are stacked in the thickness, the OLED is easily affected by optical interference. On this account, when the observation angle is changed, a problem arises in that colors are changed because of the influence of interference. To this problem, a technique is proposed in which such a structure is adopted that the peak wavelength of the intensity of interference is shorter than the peak wavelength of the emission wavelength and changes in colors caused by a difference in the observation angle are suppressed. (See Japanese Unexamined Patent Application Publication No. 2005-31251)

SUMMARY

In the case where the technique disclosed in Japanese Unexamined Patent Application Publication No. 2005-31251 is applied to a white OLED, such a structure is adopted that the peak wavelength of the intensity of interference is the emission peak wavelength corresponding to blue or less. However, in this case, the intensity of interference of the wavelength range corresponding to red is reduced to drop the light emission intensity of red. More specifically, in the case where a white OLED is implemented by B (blue)+Y (yellow), the light emission intensity of the wavelength range corresponding to red is originally smaller than the light emission intensities of other colors, and the light emission intensity of red becomes much smaller to cause the degradation of a balance with the other colors. In the case of the white OLED, since the emission wavelength range is particularly wide and the influence of interference is exerted in a much wider wavelength range, there is concern that changes in colors become great when the white OLED is observed in the oblique direction.

Moreover, in the case where R (red), G (green), B (blue), and W (white) colors are used for color filters, a color filter is also necessary for white in order to adjust a white chromaticity. Since for a color filter for white, it is necessary to adopt a blue filter whose lifetime and efficiency are low or a filter that absorbs green whose luminosity factor is high at this time, there is concern that power efficiency is degraded and a lifetime is shortened.

The other problems and novel features will be apparent from the description and accompanying drawings of the present disclosure.

The following is a brief description of the outline of a representative aspect of the present disclosure.

In other words, a display device is configured in such a manner that a stacked film configuring a white light emitting element (an organic light-emitting diode element) has the peak wavelength of the intensity of interference at the peak wavelength of the light emission intensity corresponding to blue or less. The light emission intensity of the light emitting element corresponding to a red pixel is made greater than the light emission intensities of the light emitting elements corresponding to pixels for other colors.

According to the display device, a balance can be achieved among R, G, and B colors.

DESCRIPTION OF THE PREFERRED EMBODIMENTS

In the following, an embodiment and examples will be described with reference to the drawings. However, in the following description, the same components are designated the same reference numerals and signs, and the overlapping description is omitted.

Figure 1:
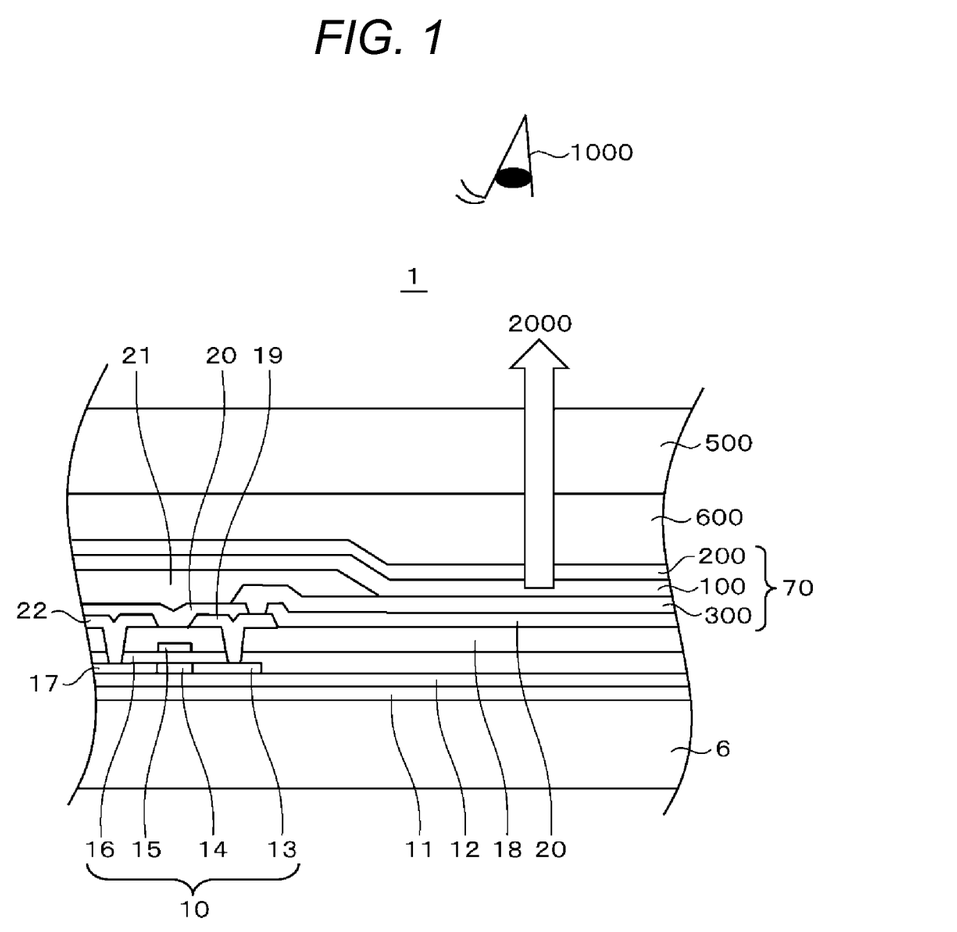
FIG. 1 is a partial cross sectional view of the schematic structure of a single pixel of a display device according to an embodiment.
Figure 2:
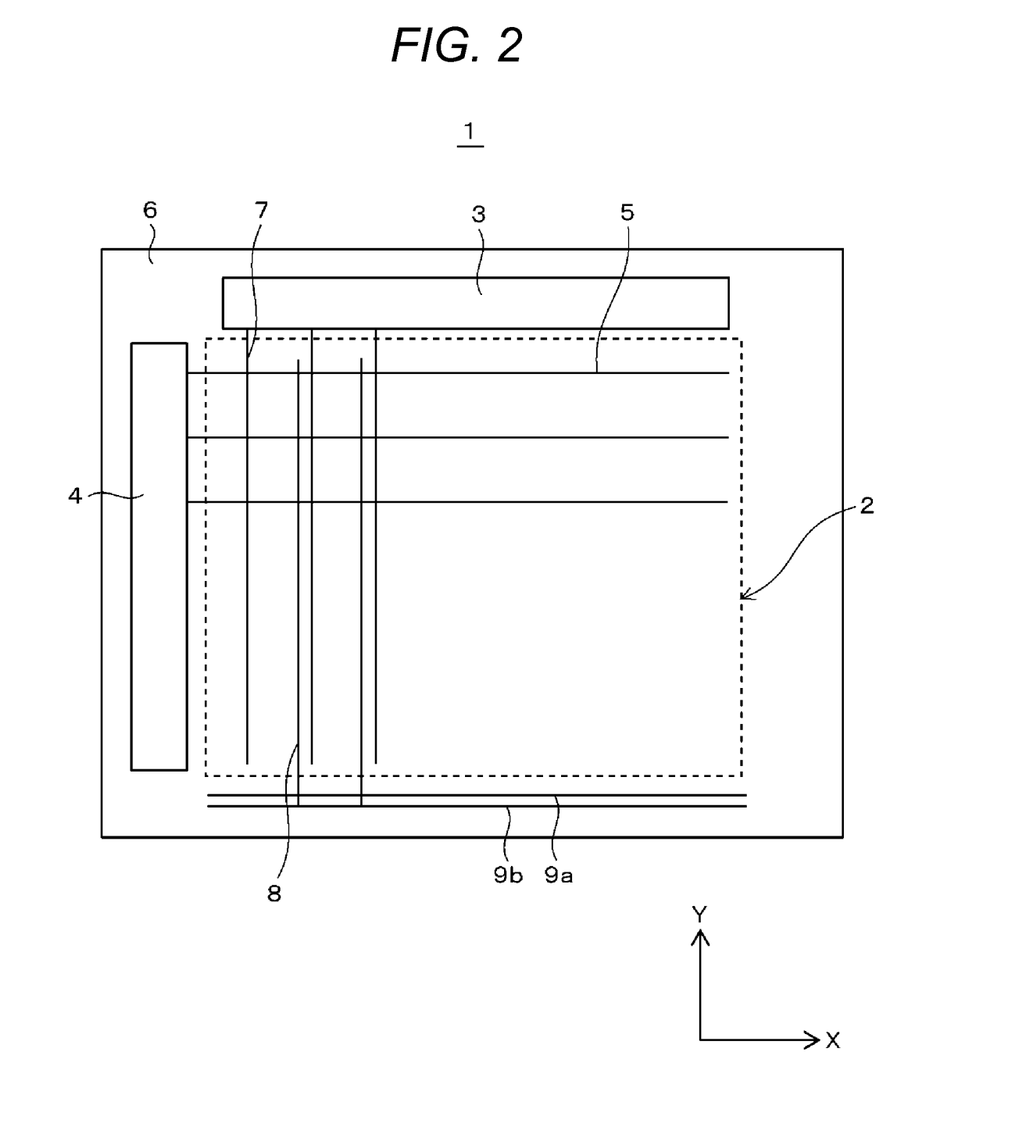
FIG. 2 is a schematic block diagram of the overall layout of the display device according to an embodiment.
Figure 3:
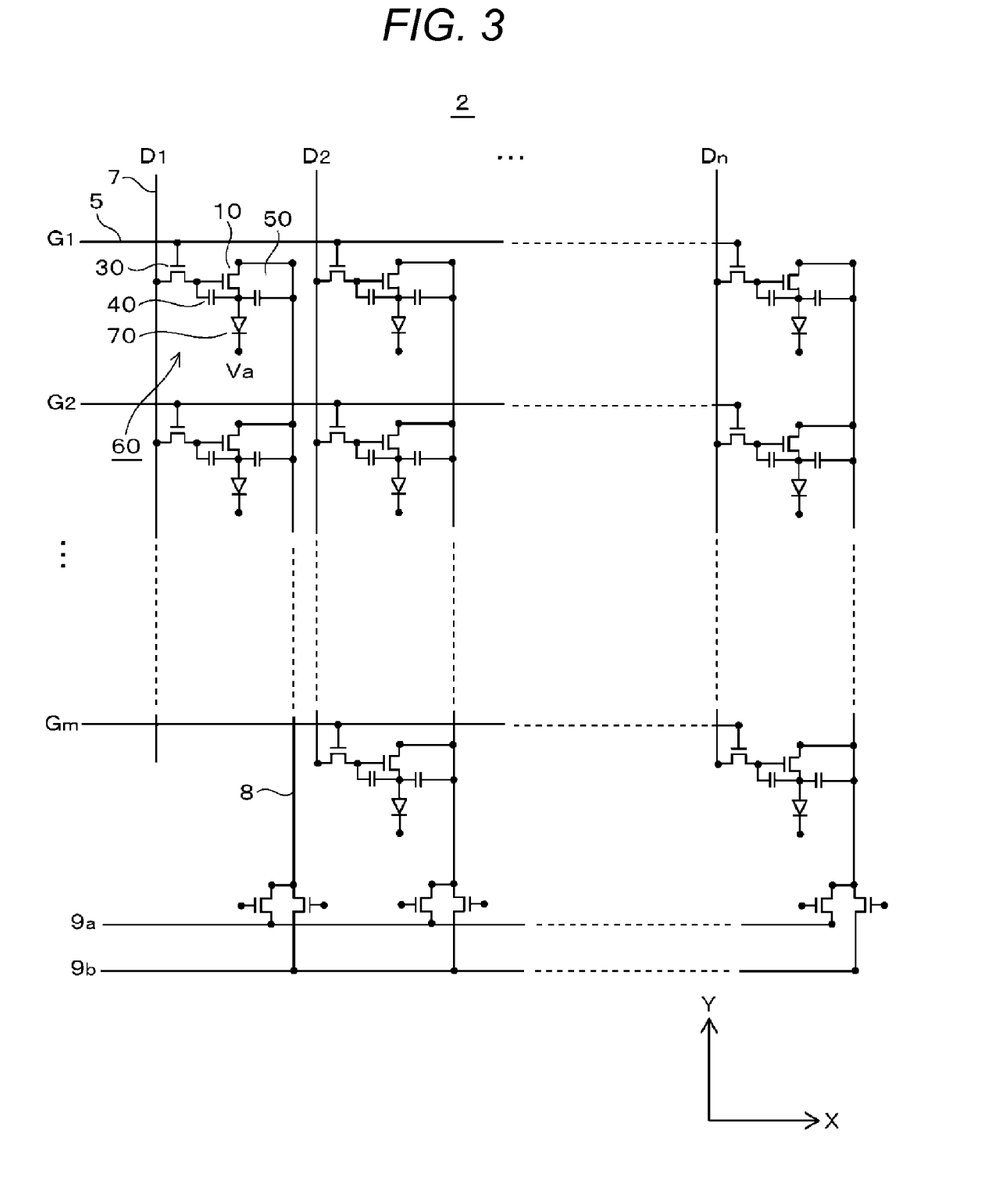
FIG. 3 is an equivalent circuit diagram of an active matrix array configuring the main part of a display unit according to an embodiment.

FIG. 1 is a partial cross sectional view of the schematic structure of a single pixel of a display device according to an embodiment. The display device 1 according to the embodiment is an active matrix drive OLED display including a switching device and an organic light-emitting diode element formed of a thin film transistor. FIG. 2 is a schematic block diagram of the overall layout of the display device according to the embodiment. FIG. 3 is an equivalent circuit diagram of an active matrix array configuring the main part of a display unit according to the embodiment.

As illustrated in FIG. 2, in the display device 1, a display unit 2 is provided in the center region of an insulating substrate 6 such as a glass substrate and a plastic substrate. The substrate 6 includes a first side extended in a first direction (an X-direction) and a second side extended in a second direction (a Y-direction) in a planar view. In FIG. 2, on the upper side of the display unit 2, a data drive circuit 3 is disposed which outputs an image signal to a data line 7 extended in the second direction (the Y-direction), and on the left side, a scan driver circuit 4 is disposed which outputs a scanning signal to a gate line 5 extended in the first direction (the X-direction). The data drive circuit 3 and the scan driver circuit 4 are configured of a shift register circuit, a level shifter circuit, an analog switch circuit, and the like formed of a circuit using a thin film transistor (TFT). Moreover, a potential line 8 is extended and disposed in the direction the same as the data line 7 (the Y-direction). The potential line 8 is connected to potential supply lines 9a and 9b through a switching device.

In the display device 1, as similar to an active matrix drive liquid crystal display device, a plurality of the gate lines (the scanning signal lines) 5 is provided on the substrate 6, and a plurality of the data lines (the data signal lines) 7 is provided, which is extended in the direction (the Y-direction) crossing the extending direction of the gate lines 5 (the X-direction). As illustrated in FIG. 3, a pixel 60 is disposed at places at which m of gate lines G1, G2, to Gm intersect with n of data lines D1, D2, to Dn in a matrix configuration. The pixels 60 are configured of an organic light-emitting diode element (a light emitting element) 70, a storage capacitor 40, a pixel capacitor 50, a switching transistor 30 formed of a TFT, and a driver transistor (a driver element) 10 formed of a TFT. In the switching transistor (a control element) 30, the gate electrode is connected to the gate line 5, the source electrode is connected to the data line 7, and the drain electrode is connected to the storage capacitor 40. Although the electrode connected to the data line 7 is sometimes called a drain electrode, in the present disclosure, the electrode is referred to as a source electrode. Although the electrode connected to the storage capacitor 40 is sometimes called a source electrode, in the present disclosure, the electrode is referred to as a drain electrode. In the driver transistor 10, the gate electrode is connected to the storage capacitor 40, the source electrode is connected to the potential supply line 8 extended in the direction the same as the data line 7 (the Y-direction), and the drain electrode is connected to one electrode (the anode) of the organic light-emitting diode element 70 and the pixel capacitor 50. Moreover, the other electrode (the cathode) of the organic light-emitting diode element configuring the light emitting element 70 is connected to a power supply line (not illustrated) common in all pixels, and the potential is maintained at a potential Va.

In driving the pixel 60, a turn-on voltage is in turn supplied from the gate line G1 in the first row, and this voltage (a scanning signal) is in turn supplied to m rows of the gate lines G1, G2, to Gm for one frame time. The scanning signal brings the switching transistor 30 into the ON-state, and then an image signal is written on the storage capacitor 40 from the data line 7 through the switching transistor 30. In other words, in the driving method, in the period in which the turn-on voltage is supplied to a certain gate line 5, the switching transistors 30 connected to the data lines 7 intersecting with the gate line 5 are all brought into the conducting state, and a data voltage is supplied to n columns of the data lines D1, D2, to Dn in synchronization with the conduction.

In the period in which the turn-on voltage is supplied to the gate line 5, the data voltage is stored on the storage capacitor 40, and the gate electrode of the driver transistor 10 is maintained almost at the potential corresponding to the image signal for a certain period by the storage capacitor 40 even though the switching transistor 30 is brought into the OFF state. The voltage value of the storage capacitor 40 regulates the gate voltage of the driver transistor 10, the value of the current carried through the driver transistor 10 is controlled by the regulation, and the light emission of the organic light-emitting diode element 70 is controlled. The halt of light emission is implemented by bringing the driver transistor 10 into the OFF state.

In other words, the voltage corresponding to image information is applied through the data line 7 in synchronization with the application of the turn-on voltage to the gate line 5 corresponding to the pixel 60 whose light emission quantity has to be controlled, so that the light emission quantity of the pixel 60 can be controlled. With these operations, the light emission quantity of a plurality of pixels configuring the display unit 2 is controlled according to image information, so that a desired image can be displayed.

Next, the structure in the vicinity of a single pixel of the display device 1 will be described with reference to FIG. 1. The display device 1 is a so-called top emission OLED display in which light is extracted from the direction opposite to the substrate 6 on which the organic light-emitting diode element 70 is formed. In other words, the display device 1 emits light to the upper side (the sealing member 500 side) in FIG. 1, and an observer 1000 sees light 2000.

The display device 1 includes the switching devices (the driver transistor 10 and the switching transistor 30, which are not illustrated in FIG. 1) on the insulating substrate 6 such as a glass substrate and a plastic substrate. The switching devices such as the driver transistor 10 and the switching transistor 30 configuring the pixel circuit are configured of a thin film transistor (TFT). The thin film transistor includes a gate insulating film 16, a gate line layer 15, a first interlayer insulating film 18, a source electrode layer 22, a drain electrode layer 19, and a second interlayer insulating film 20 on a polysilicon layer including a source region 17, a drain region 13, a channel polysilicon layer 14, and so on. Moreover, in the case where the substrate 6 is a glass substrate, a first base film 11 formed of a SiNx (silicon nitride) film, for example, is included between the thin film transistor and the substrate 6 for preventing the intrusion of ions such as Na (sodium) and K (potassium) into the channel polysilicon layer 14 and the gate insulating film 16. Furthermore, a second base film 12 formed of a SiOx (silicon oxide) film, for example, is included between the first base film 11 and the polysilicon layer.

A lower electrode 300 configuring the organic light-emitting diode element 70 is formed in an island shape so as to cover a portion to be a luminous region of the pixel. In the formation, the lower electrode 300 is connected to the drain electrode 19 through a hole penetrated through the second interlayer insulating film 20.

A third interlayer insulating film 21 including an opening corresponding to the luminous region of the pixel is formed on the peripheral part of the lower electrode 300 and a non-luminous region such as the driver transistor 10, the data line 7, which is not illustrated in FIG. 1, and the gate line 8, which is not illustrated in FIG. 1. An organic film 100 including the light emitting layer is formed on the lower electrode 300 so as to cover the entire surface of the display unit 2. However, on the regions other than the luminous region, the organic film 100 is isolated from the lower electrode 300 with the third interlayer insulating film 21. An upper electrode 200 is formed on the organic film 100 on the entire surface of the display unit 2.

Such a film can be used for the organic film 100 of the organic light-emitting diode element 70 that an electron transport layer, a light emitting layer, and a hole transport layer are stacked between the upper electrode 200 and the lower electrode 300 from the cathode (the upper electrode 200, for example) side.

This organic light-emitting diode element 70 is one in which a direct current voltage is applied across the upper electrode 200 and the lower electrode 300, holes injected from the anode (the lower electrode 300, for example) side reach the light emitting layer through the hole transport layer, electrons injected from the cathode side reach the light emitting layer through the electron transport layer, and the electrons are recombined with the holes to emit light at a predetermined wavelength here. It is noted that a material that can be used for both of the light emitting layer and the electron transport layer may be used for the organic film 100 of the organic light-emitting diode element 70. Moreover, such a film may be used that an anode buffer layer or a hole injection layer is disposed between the anode and the hole transport layer.

It is noted that it is desirable that the lower electrode 300 be configured of a material of a high light reflectance in order to improve the use efficiency of light emitted from the light emitting layer. Furthermore, for the organic film 100, such a material or a structure is adopted in which a predetermined voltage is applied across the anode and the cathode to carry an electric current and then white light emission is obtained. For the organic light-emitting diode element 70 that implements white light emission, there are methods in which a plurality of light emitting layers in different light emission colors is stacked in a structure called a multi-photon, and in which dies in different light emission colors are doped into a single light emitting layer. For any methods, it is desirable to use one that a high luminous efficiency is provided and white light emission of a long lifetime is obtained for the white organic light-emitting diode element 70. It is noted that the organic film 100 is configured of a plurality of layers including the light emitting layer, the hole transport layer, and the electron transport layer, and may include an inorganic layer in some cases.

A transparent sealing member 500 is disposed on the upper electrode 200. Desirably, the sealing member 500 has a high gas barrier property and transmits visible light in order to prevent moisture from entering the organic light-emitting diode element. More specifically, a glass substrate or a plastic substrate processed to improve a gas barrier property can be used. Moreover, desirably, the sealing member 500 is additionally provided with an optical function such as color reproduction by forming a color filter, not illustrated, or by forming a black matrix as necessary. Solid sealing may be provided in which a transparent filler 600 made of a polymeric material is filled between the sealing member 500 and the upper electrode 200 for enclosure. Alternatively, it may be fine that an inert gas such as nitrogen is filled between the sealing member 500 and the upper electrode 200, and the substrate 6 and the picture frame portion of the transparent substrate are enclosed and sealed with a sealing material.

In the display device 1, the organic light-emitting diode elements 70 of the pixels emit white light, and full color display is implemented in combination with color filters corresponding to three primary colors. In other words, white light emitting elements are disposed in a matrix configuration in a predetermined order, and a color filter that transmits red (R) light is provided for a red pixel that exhibits red, a color filter that transmits green (G) light is provided for a pixel that exhibits green, and a color filter that transmits blue (B) light is provided for a pixel that exhibits blue on the light extraction side of the light emitting elements.

Figure 4:
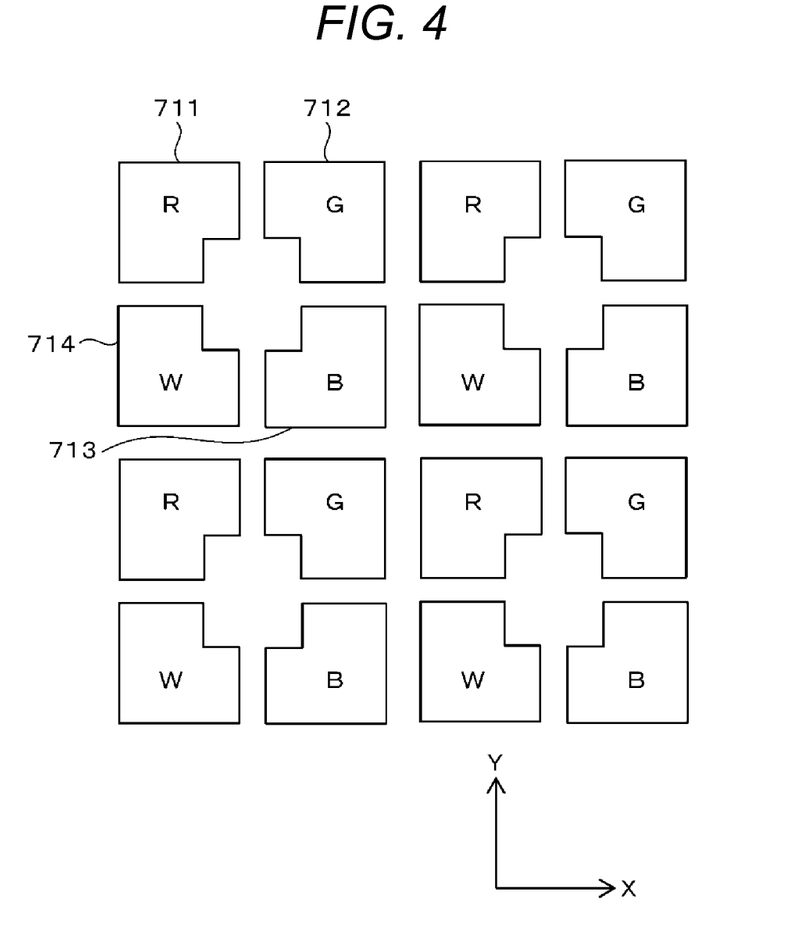
FIG. 4 is a plan view of an exemplary color filter array of the display device according to an embodiment.

FIG. 4 is a plan view of an exemplary color filter array of the display device according to the embodiment. A color filter 712 that transmits green light is disposed next to the right of a color filter 711 that transmits red light. A color filter 713 that transmits blue light is disposed next to below the color filter 712. A color filter 714 that transmits white (W) light is disposed next to the right of the color filter 713. The color filter 711 is disposed next to above the color filter 714. Here, a display device will be described more specifically, which includes a pixel that exhibits white in addition to pixels for R, G, and B colors for reducing the power consumption of the display device 1. However, the display device 1 is not limited thereto. It is noted that although it is unnecessary to provide a color filter for the pixel that exhibits white, a color filter may be disposed for adjusting the white chromaticity as necessary. It may be fine that colors are applied to the color filters by publicly known techniques such as dyeing, pigment dispersion, and printing.

Next, the conditions for the intensity of interference in the light emitted from the light emitting layer will be described, which is the basis of the embodiment. In the embodiment, in the display device including the light emitting elements configuring a plurality of pixels disposed in a matrix configuration, films at least on the luminous region of the pixel are configured in such a manner that a wavelength at which the intensity of interference in the light emitted from the light emitting layer (in the following, simply referred to as "the intensity of interference") takes the maximum value at a viewing angle of zero degree is a wavelength on the shortest wavelength side or less at which the intensity of the light emitted from the light emitting layer (in the following, simply referred to as "the light emission intensity") takes the maximum value. In other words, in the case where the wavelength at which the intensity of interference takes the maximum value at a viewing angle of zero degree is defined as $\lambda i\max$ and the wavelength on the shortest wavelength side at which the light emission intensity takes the maximum value is defined as $\lambda e\max$, a film is configured in which the following relationship (Expression (1)) is satisfied:

$$\lambda i\max \leq \lambda e\max \tag{1}$$

In the configuration, it is desirable that the wavelength at which the intensity of interference takes the minimum value at a viewing angle of zero degree be not in the visible wavelength range of a wavelength of 680 nm or less.

Expression (1) is defined as a condition, the maximum value of the intensity of interference moves away from the emission wavelength range, the minimum value of the intensity of interference does not reach the wavelength range in which the light emission intensity is great, even though the viewing angle is increased and the wavelength at which the intensity of interference takes an extreme value (the maximum value or the minimum value) is moved to the short wavelength side. On this account, although the effect of interference reduces the absolute value of the intensity of light extracted to the observer 1000 side, changes in the ratio of the light emission intensity to the emission wavelengths (the shape of the emission spectrum) are small, and changes in colors caused by the viewing angle are suppressed. In other words, since changes in colors caused when the viewing angle is changed are increased in the case where the wavelength at which the intensity of interference takes the maximum value or the minimum value is passed through the wavelength at which the light emission intensity takes the maximum value, it is important that the wavelength at which the intensity of interference takes the maximum value or the minimum value does not reach the wavelength at which the light emission intensity takes the maximum value even though the viewing angle is changed.

Moreover, in the display device 1, it is desirable to satisfy the following relationship (Expression (2)) in the case where the wavelength at which the intensity of interference takes the maximum value at a viewing angle of zero degree is defined as λimax and the wavelength on the shortest wavelength side at which the light emission intensity takes the maximum value is defined as λemax:

$$\lambda\text{emax}-50\text{ nm}\leq\lambda\text{imax}<\lambda\text{emax} \quad (2)$$

This is because when the wavelength λimax at which the intensity of interference takes the maximum value is displaced from the wavelength λemax at which the light emission intensity takes the maximum value to the short wavelength side by a wavelength of 50 nm or greater, the intensity of light actually observed by the observer is considerably reduced to about a half depending on the conditions.

It is noted that the longer the wavelength is, the greater the shift of the wavelength is, at which the intensity of interference takes an extreme value caused by a change in the viewing angle. On this account, when the wavelength at which the intensity of interference takes the minimum value at a viewing angle of zero degree is defined as λimin, it is desirable to satisfy the following relationship (Expression (3)):

$$\lambda\text{emax}+200\text{ nm}\leq\lambda\text{imin} \quad (3)$$

Even though the viewing angle is increased and the wavelength at which the intensity of interference takes the minimum value is moved to the short wavelength side, the minimum value of the intensity of interference does not reach the wavelength at which the light emission intensity takes the maximum value, and thus a change in the shape of the emission spectrum is made small, and changes in colors caused by the viewing angle are suppressed.

Therefore, the conditions of Expression (2) and Expression (3) are satisfied, and the light emission intensity of the wavelength corresponding to blue is increased near a viewing angle of zero degree because of interference, so that changes in colors caused by the viewing angle can be suppressed, and a display device that exhibits brighter blue can be implemented simultaneously.

Figure 5:
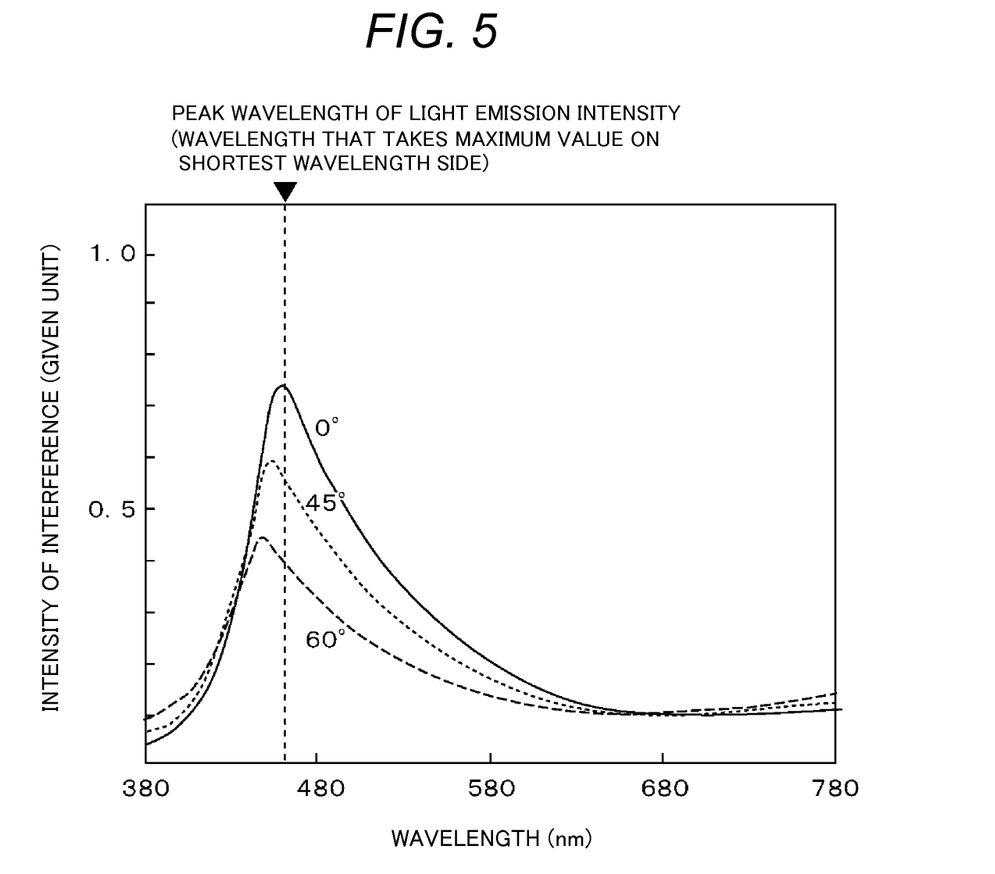
FIG. 5 is a diagram of the relationship between the wavelength dependence of the intensity of interference and the shortest wavelength at which the light emission intensity takes the maximum value at viewing angles of 0°, 45°, and 60° in the display device according to an embodiment.
Figure 6:
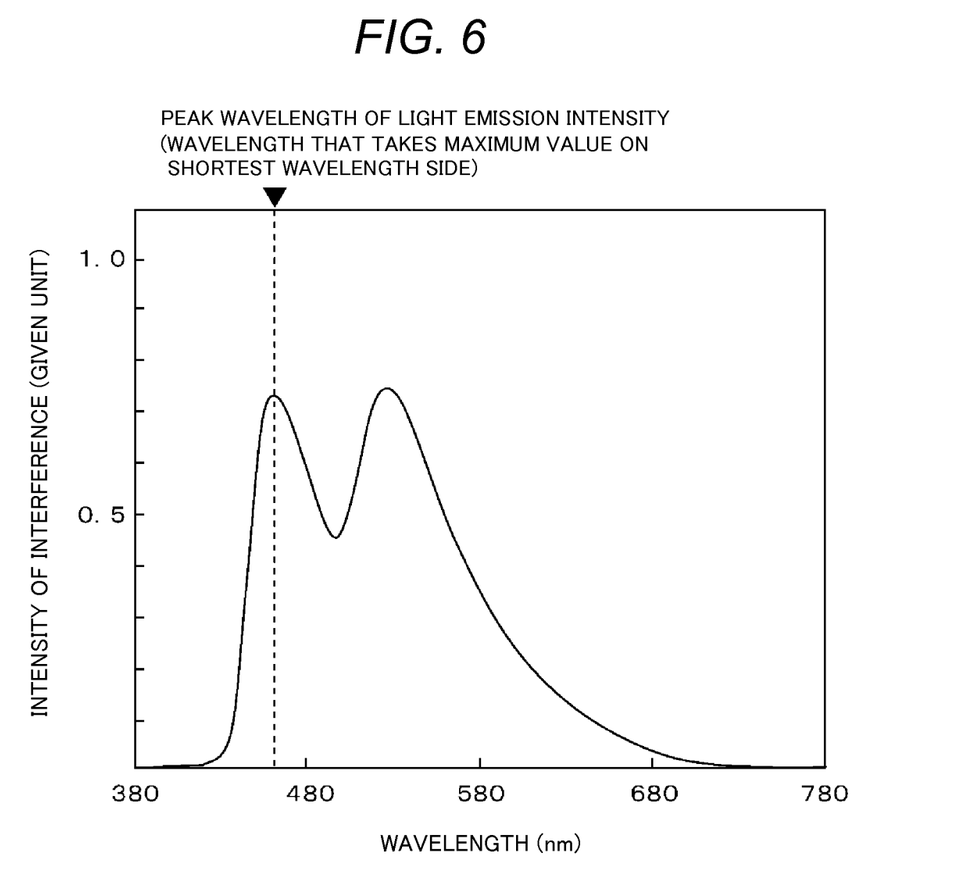
FIG. 6 is a graph of an example of the wavelength dependence of the light emission intensity (the emission spectrum) of a white organic light-emitting diode element.

FIG. 5 is a diagram of the relationship between the wavelength dependence of the intensity of interference and the shortest wavelength at which the light emission intensity takes the maximum value at viewing angles of 0°, 45°, and 60° in the display device according to the embodiment. The shortest wavelength at which the light emission intensity takes the maximum value is a wavelength of about 460 nm, and the wavelength at which the intensity of interference takes the maximum value at a viewing angle of zero degree is a wavelength of about 455 nm. Moreover, the wavelength at which the intensity of interference takes the minimum value at a viewing angle of zero degree is greater than a wavelength of 680 nm. In the white organic light-emitting diode element 70, a plurality of the maximum values of the light emission intensity generally exists in the visible wavelength range. FIG. 6 is a graph of an example of the wavelength dependence of the light emission intensity (the emission spectrum) of the white organic light-emitting diode element in the display device according to the embodiment. The shortest wavelength at which the light emission intensity takes the maximum value is a wavelength of about 460 nm. For example, in the case of using a light emitting layer that emits light corresponding to red, green, and blue for a light emitting layer, the layer has three maximum values corresponding to red, green, and blue or two maximum values in total that the emission wavelengths of red and green are combined to provide one maximum value. Alternatively, in the case of using a light emitting layer that emits light corresponding to blue and yellow (Y) for a light emitting layer, the layer has two maximum values corresponding to blue and yellow. In any cases, in the white organic light-emitting diode element 70, the wavelength on the shortest wavelength side at which the light emission intensity takes the maximum value becomes a wavelength corresponding to blue.

In the embodiment, the wavelength on the shortest wavelength side at which the light emission intensity takes the maximum value is a wavelength of about 460 nm, the wavelength at which the intensity of interference takes the maximum value at a viewing angle of zero degree is a wavelength of 455 nm, and a state is provided in which the minimum value of the intensity of interference does not exist in the wavelength range of 680 nm or less. In other words, Expression (1), Expression (2), and Expression (3) are satisfied. This state can be implemented by adjusting the film thickness of the upper electrode 200 or the film thickness of the organic film 100, that is, by adjusting the film thicknesses of the hole injection layer, not illustrated, the hole transport layer, the light emitting layer, and the electron transport layer, for example. The specific conditions infinitely exist, and a person skilled in the art can easily implement the state. In the implementation, it is necessary to consider the optical viewpoint as well as the electrical viewpoint for the film thicknesses of the layers.

Since the optical distance is changed as the viewing angle is increased, the maximum value or the minimum value of the intensity of interference is shifted on the short wavelength side. However, as illustrated in FIG. 5, when the conditions according to the embodiment (Expression (2) and Expression (3)) are satisfied, the maximum value or the minimum value of the intensity of interference is not shifted to the wavelength range in which the light emission intensity is great even though the viewing angle is increased, so that the shape of the emission spectrum is little changed. Therefore, the display device with small changes in colors can be implemented even though the viewing angle is changed.

It is noted that as illustrated in FIG. 5, in the case where these conditions are satisfied, since the intensity of interference is small in the wavelength range corresponding to red (a wavelength range of about 630 nm to 750 nm), the intensity of light extracted to the observer side is reduced.

Therefore, in the pixel for red, the light emission intensity of the light emitting element is increased as compared with the pixels for other colors. For example, in the pixel for red, an electric current that can be carried through the organic light-emitting diode is increased as compared with the pixels for other colors (the maximum value of an electric current that can be carried is increased). Alternatively, in the pixel for red, the light emission area of the organic light-emitting diode is increased as compared with the pixels for other colors. In this case, in the organic light-emitting diode element of the red pixel in which the intensity of light is reduced because of the effect of the interference, the light emission intensity can be increased more than in the organic light-emitting diodes of the pixels for other colors, so that the intensity of red light extracted to the observer side can be increased.

The summary is as follows.

(1) The stacked film configuring the white light emitting element (the organic light-emitting diode element) is configured in such a manner that the peak wavelength of the intensity of interference is the peak wavelength of the light emission intensity corresponding to blue or less (referred to as structure 1).

More specifically, in the case where the wavelength at which the intensity of interference in the light emitted from the light emitting layer configuring the light emitting element takes the maximum value at a viewing angle of zero degree is defined as λimax, the wavelength at which the intensity of interference takes the minimum value is defined as λimin, and the wavelength on the shortest wavelength side is defined as λemax in the wavelength at which the intensity of the light emitted from the light emitting layer takes the maximum value, the relationships below are satisfied:

$$\lambda emax-50nm \leq \lambda imax \leq \lambda emax$$

$$\lambda emax+200\ nm \leq \lambda imin$$

(2) The light emission intensity of the light emitting element corresponding to the red pixel is allowed to increase more than the light emission intensities of the light emitting elements corresponding to the pixels for other colors (referred to as structure 2).

(2-1) In other words, an electric current that can be carried through the light emitting element corresponding to the red pixel is allowed to increase more than an electric current that can be carried through the light emitting elements corresponding to the pixels for other colors (the maximum value of an electric current that can be carried is increased) (referred to as structure 2-1).

More specifically, in the circuit of the pixel for red, the following is provided as compared with the pixels for other colors.

(a) A ratio W/L of the driver transistor (the pixel TFT) is increased.

(b) A capacitance ratio (=C1/(C1+C2)) of the pixel circuit is increased.

Here, structure 2-1 can adopt any one of (a) and (b) or both of (a) and (b).

(2-2) The light emission area of the light emitting element corresponding to the red pixel is increased more than the light emission areas of the light emitting elements corresponding to the pixels for other colors (referred to as structure 2-2).

Structure 1 is provided, that is, the structure of the light emitting element is provided in such a manner that the peak wavelength of the intensity of interference in the light emitted from the light emitting layer of the light emitting element is the peak wavelength of the light emission intensity corresponding to blue or less, and a change in the shape of the emission spectrum is reduced when the intensity of interference is shifted to the short wavelength side at the time of increasing the visual angle. In other words, when the intensity of interference is shifted to the short wavelength side in oblique observation, the light emission intensity is reduced. However, the shapes of the emission spectra, that is, the relationship of the magnitude among the light emission intensities of the wavelengths is not changed so much. On this account, although the luminosity is slightly reduced in oblique observation, changes in colors are suppressed. Moreover, in structure 1, the light emission intensity can be increased at the wavelength corresponding to blue because of the interference effect, that is, a microcavity effect. Generally, the lifetime and efficiency of blue luminescent materials are inferior to green and red luminescent materials, and triplet materials, which can obtain a high luminous efficiency, are not put into actual use. Therefore, when the effective blue light emission intensity is increased, a balance with the other colors is improved, and such effects are also obtained that the luminous efficiency is improved and the lifetime of the light emitting element is prolonged.

Structure 2-1 allows the light emission intensity of the light emitting element corresponding to the red pixel to be increased more than the light emission intensities of the light emitting elements corresponding to the pixels for other colors. The effect can increase the red intensity whose light emission intensity becomes weak because of the adoption of structure 1, and it is possible to implement a display device that a balance is achieved among R, G, and B colors.

In structure 2-2, in the case where the same electric current is carried through the organic light-emitting diode elements of the pixels, the electric current carried per unit area of the light emitting element is reduced because only the area of the luminous region of the light emitting element corresponding to the red pixel is wide. Here, in the light emitting element formed of an organic light-emitting diode element, generally, the luminous efficiency is improved as the current value per unit area is reduced. On this account, in the case where the value of a current carried through per pixel is the same, in the pixel whose light emission area is large, the current value per unit area of the light emitting element is reduced to improve the luminous efficiency, and the light emission intensity is increased accordingly. As a result, it is possible to increase the light emission intensity of red whose light emission intensity becomes weak because of the adoption of structure 1, and it is possible to implement a display device that a balance is achieved among R, G, and B colors.

Moreover, in the case where an electric current that can be carried through the light emitting element corresponding to the red pixel is increased because of the adoption of structure 2-1, there is concern that the lifetime becomes shorter, the luminous efficiency is more degraded, and electric power is more increased than in the light emitting elements of the pixels for other colors. However, the electric current carried per unit area of the light emitting element is reduced because of the adoption of structure 2-2, so that it is possible to improve the lifetime and luminous efficiency of the light emitting element corresponding to the red pixel.

According to the display device that adopts the structures, it is possible to reduce changes in colors when the observation angle is changed. Moreover, the light emission intensities of red and blue are increased, so that it is possible to secure the luminosity and to widen the range of color reproduction even though a color filter of a higher color purity and a low transmittance is combined.

First Example

Figure 7:
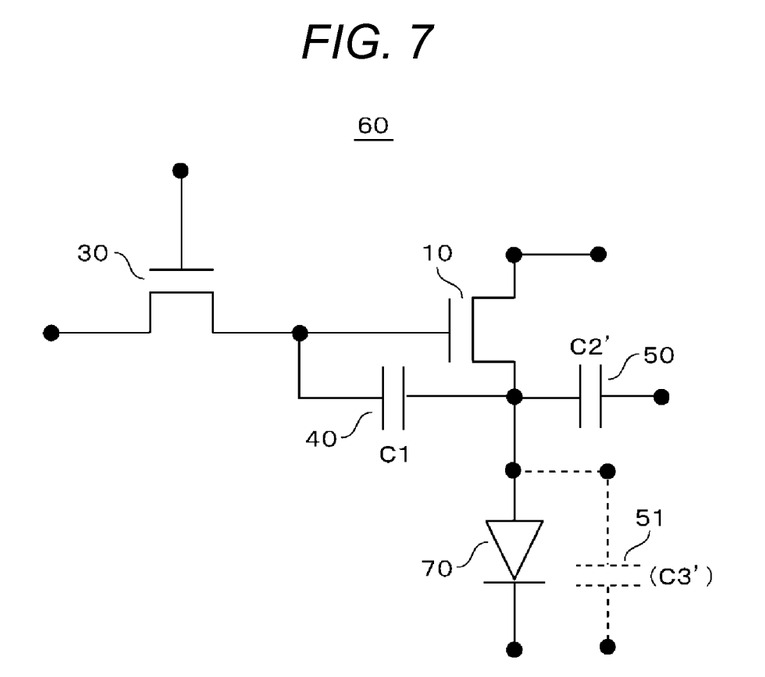
FIG. 7 is an equivalent circuit diagram of an exemplary pixel circuit of a display device according to a first example.

FIG. 7 is an equivalent circuit diagram of an exemplary pixel circuit of a display device according to an example. A pixel 60 includes an organic light-emitting diode element (a light emitting element) 70, a storage capacitor 40, a pixel capacitor 50, a switching transistor 30 formed of a TFT, and a driver transistor 10 formed of a TFT. However, in the equivalent circuit diagram in FIG. 7, a parasitic capacitor 51 of the organic light-emitting diode 70 is additionally provided in the equivalent circuit diagram in FIG. 3.

(1) Scheme 1

The channel width of the driver transistor 10 is defined as W, the channel length is defined as L, and the ratio W/L is configured in such a manner that the ratio W/L is greater in the pixel for red than in the pixels for other colors. In the case where the channel width of the thin film transistor configuring the driver transistor 10 of the red pixel is defined as $W_R$, the channel length is defined as $L_R$, the channel width of the thin film transistor configuring the driver transistor 10 of the green pixel is defined as $W_G$, the channel length is defined as $L_G$, the channel width of the thin film transistor configuring the driver transistor 10 of the blue pixel is defined as $W_B$, the channel length is defined as $L_B$, the channel width of the thin film transistor configuring the driver transistor 10 of the white pixel is defined as $W_W$, and the channel length is defined as $L_W$, the channel widths and the channel lengths are configured so as to satisfy relational expressions below.

$$W_R/L_R > W_G/L_G$$

$$W_R/L_R > W_B/L_B$$

$$W_R/L_R > W_W/L_W$$

(2) Scheme 2

When the capacitance of the storage capacitor 40 is defined as C1, the capacitance of the pixel capacitor 50 is defined as C2', and the capacitance of the pixel capacitor 51 is defined as C3', the capacitances are configured in such a manner that the value of C1/(C1+(C2'+C3')) is smaller in the pixel for red than in the pixels for other colors. Here, suppose that the pixel capacitor that the capacitance C2' of the pixel capacitor 50 is combined with the capacitance C3' of the pixel capacitor 51 is defined as C2, C1/(C1+(C2'+C3'))=C1/(C1+C2) is held. In the case where the storage capacitance of the red pixel is defined as $C1_R$, the pixel capacitance is defined as $C2_R$, the storage capacitance of the green pixel is defined as $C1_G$, the pixel capacitance is defined as $C2_G$, the storage capacitance of the blue pixel is defined as $C1_B$, the pixel capacitance is defined as $C2_B$, the storage capacitance of the white pixel is defined as $C1_W$, and the pixel capacitance is defined as $C2_W$, the channel widths and the channel lengths are configured so as to satisfy relational expressions below.

$$C1_R/(C1_R C2_R) < C1_G/(C1_G C2_G)$$

$$C1_R/(C1_R+C2_R) < C1_B/(C1_B+C2_B)$$

$$C1_R/(C1_R+C2_R) < C1_W/(C1_W+C2_3)$$

With the adoption of any one of scheme 1 and scheme 2 or both of scheme 1 and scheme 2, an electric current that can be carried through the organic light-emitting diode element of the pixel for red can be increased more than an electric current that can be carried through the organic light-emitting diode corresponding to the pixels of the other colors (the maximum value of an electric current that can be carried is increased). In this case, it is possible that a much greater amount of an electric current is carried through the organic light-emitting diode element of the red pixel, in which the intensity of light extracted to the observer side is reduced, and the light emission intensity is increased depending on the conditions for the intensity of interference, so that it is possible to implement a display device that a balance is achieved among the light emission intensities of R, G, and B colors.

Moreover, in the color filter that color purity can be improved, the transmittance is generally low. However, the light emission intensity of blue is increased using the conditions for the intensity of interference according to the embodiment (Expression (2) and Expression (3)), and the current value of the pixel for red is increased and the light emission intensity of the red pixel is increased by scheme 1 or scheme 2, and then a color filter of a high color purity is combined, so that it is possible to implement a bright display device having a wide range of color reproduction.

Furthermore, triplet materials that can obtain a high luminous efficiency for blue are not put to practical use in full scale, and the lifetime and the efficiency are inferior to the lifetime and efficiency of green and red luminescent materials. In the example, the light emission intensity of blue can be increased by the effect of interference, so that the lifetime and efficiency of blue can be improved.

Second Example

Figure 8:
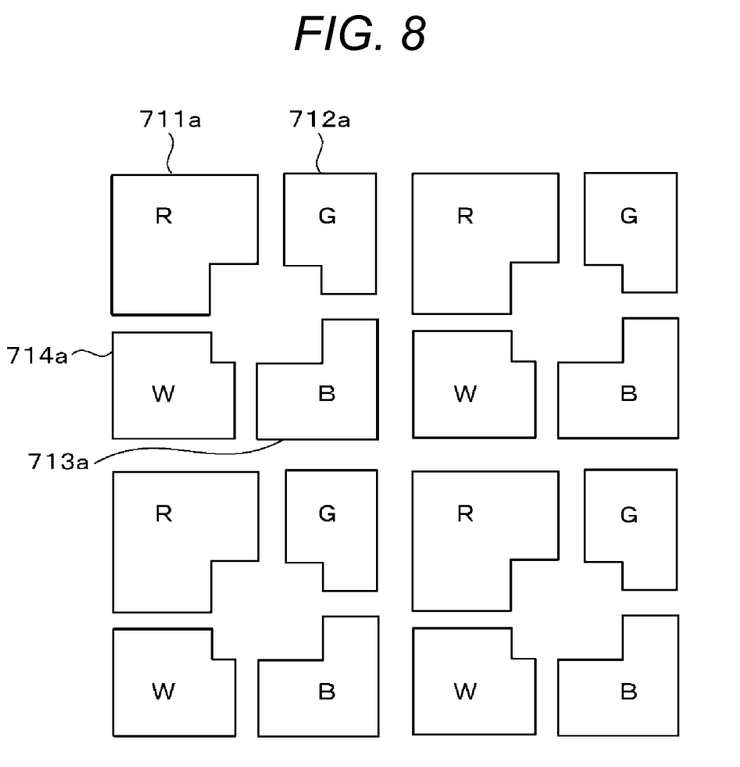
FIG. 8 is a plan view of an exemplary color filter array of a display device according to a second example.

FIG. 8 is a plan view of an exemplary color filter array of a display device according to a second example. Although a color filter array in FIG. 8 is the same as the color filter array in FIG. 4, the size of a color filter 711a that transmits red light is greater than the sizes of a color filter 712a that transmits green light, a color filter 713a that transmits blue light, and a color filter 714a that transmits white light. The right side of the color filter 711a extends in the direction of the color filter 712a, and the lower side extends in the direction of the color filter 714a. The example is that the light emission area of the pixel for red is made greater than the light emission areas of the pixels for other colors in the conditions for the intensity of interference according to the embodiment (Expression (2) and Expression (3)). In other words, the area of a lower electrode 300 configuring the organic light-emitting diode element 70 is made greater in the pixel for red than in the pixels for other colors, and the area is made greater in the pixel whose light emission area defined by an insulating film 21 formed on the peripheral part of the lower electrode 300 corresponding to red than in the pixels for other colors. In other words, in the case where the light emission area defined by the insulating film formed on the peripheral part of the lower electrode 300 configuring the organic light-emitting diode element 70 is defined as AR in the red pixel, AG in the green pixel, AB in the blue pixel, and AW in the white pixel, the channel widths and the channel lengths are configured so as to satisfy relational expressions below. The configurations other than the configurations described above are the same as the first example.

$$AR > AG$$

$$AR > AB$$

$$AR > AW$$

In this case, when the size of the driver transistor 10 and the capacitances of the storage capacitor 40, the pixel capacitor 50, and the organic light-emitting diode element 70 are the same, an electric current carried through the organic light-emitting diode element per unit area is made smaller in the pixel for red. Here, in the light emitting element formed of an organic light-emitting diode element, generally the luminous efficiency is improved and the lifetime is prolonged as the current value per unit area is reduced. On this account, in the case where the value of a current carried through per pixel is the same, in the pixel whose light emission area is large, the current value per unit area of the light emitting element is reduced to improve the luminous efficiency, and the light emission intensity is increased accordingly. On this account, although the light emission intensity of the wavelength corresponding to red is weakened because of the conditions for the intensity of interference according to the embodiment (Expression (2) and Expression (3)), the area is widened in the pixel for red to increase the light emission quantity and to reduce the light emission intensity, so that it is possible to implement a display device that a balance is achieved among the light emission intensities of R, G, and B colors.

Moreover, in the case of the first example, an electric current that can be carried through the organic light-emitting diode element of the pixel for red is increased, and the light emission intensity can be increased. However, when an electric current carried through the organic light-emitting diode element per unit area is increased, there is concern that the luminous efficiency is degraded or the lifetime becomes short. However, the light emission area of the pixel for red is made greater than the light emission areas of the pixels for other colors, and the electric current carried per unit area in the organic light-emitting diode element of the pixel for red is reduced as in the example, so that such effects can be obtained that the luminous efficiency of the light emitting element of the pixel for red is improved and the lifetime is prolonged. In other words, it is possible to implement a display device that the power consumption is low and the lifetime is long. It is noted that the first example may be combined with the second example.

Figure 9:
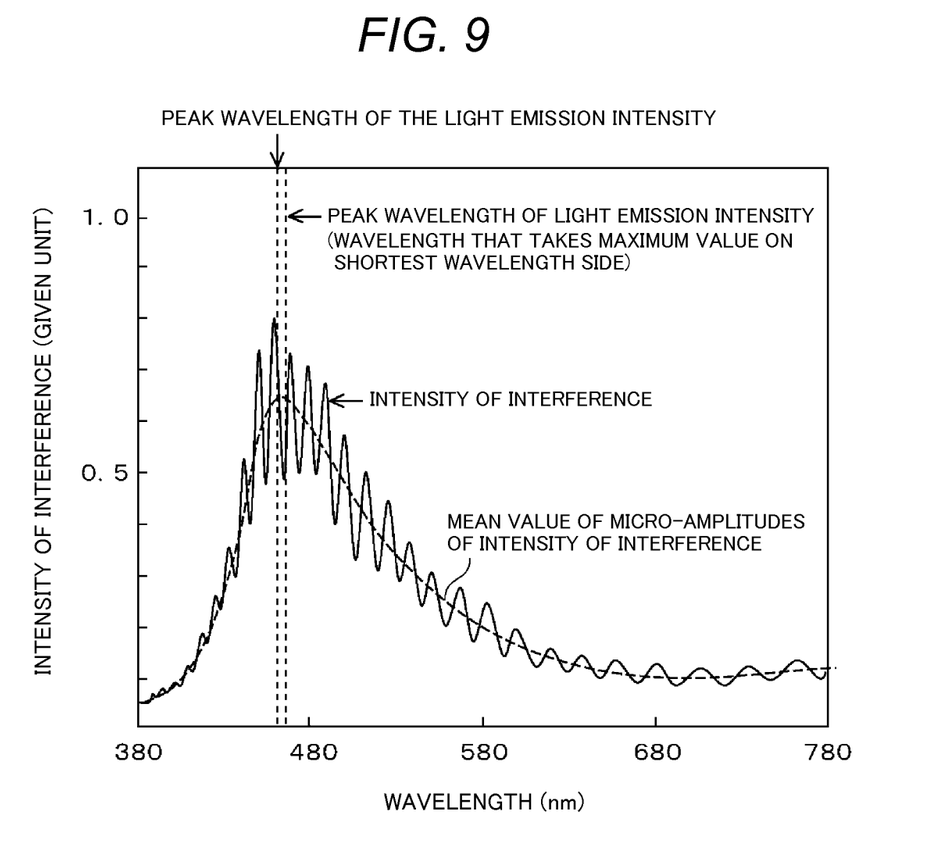
FIG. 9 is a diagram of an example of the relationship between the wavelength dependence of the intensity of interference and the shortest wavelength at which the light emission intensity takes the maximum value at a viewing angle of zero degree in the display device according to an embodiment.

FIG. 9 is a diagram of an example of the relationship between the wavelength dependence of the intensity of interference and the shortest wavelength at which the light emission intensity takes the maximum value at a viewing angle of zero degree in the display device according to the embodiment. In this case, although a plurality of extreme values of the intensity of interference exists in the visible wavelength range, it is important in the embodiment that a micro period of the intensity of interference is not considered. More specifically, in the case where the period of the intensity of interference, that is, the width of the wavelength between the maximum values of the intensities of interference adjacent to each other is a wavelength of 20 nm or less, the median value of the amplitudes of the intensities of interference, that is, the average of the maximum values adjacent to each other is considered to be the intensity of interference. In other words, since the component of the short period of the intensity of interference has a small amplitude of the intensity of interference and has a small influence, it is considered in the embodiment that a line connecting the mean values of the micro-amplitudes of the intensities of interference is the wavelength dependence of the intensity of interference (expressed by a dotted lines in FIG. 9).

It is noted that in the description above, the case is described where the structure of the light emitting element is formed in which the peak wavelength of the intensity of interference in the light emitted from the light emitting layer of the light emitting element is the peak wavelength of the light emission intensity corresponding to blue or less and a change in the shape of the emission spectrum when the intensity of interference is shifted to the short wavelength side is reduced at the maximum at the time of increasing the visual angle. However, the present disclosure is not limited thereto.

In other words, although the maximum suppression effect is not obtained with respect to changes in colors in the case where the viewing angle is increased, the peak wavelength of the intensity of interference in the light emitted from the light emitting layer of the light emitting element is set in the wavelength range other than the wavelength range corresponding to red (a visible wavelength range of 600 nm or greater), that is, the peak wavelength is set in a wavelength range shorter than the wavelength range corresponding to green (a visible wavelength range of 600 nm or less), so that it is possible to reduce changes in colors. Also in this case, the light emission intensity of the wavelength corresponding to red is relatively smaller than the light emission intensity of the wavelength corresponding to blue or green. Therefore, scheme 1 or scheme 2 described in the first example, or the technique described in the second example is adapted, and the light emission quantity of the pixel for red is increased, and a reduction in the light emission intensity is suppressed, so that it is possible to implement a display device that a balance is achieved among the light emission intensities of R, G, and B colors, or it is possible to implement a display device that the power consumption is low and the lifetime is long.

In other words, although other than the case where the light emission intensity of the wavelength corresponding to red is weakened because of the conditions for the intensity of interference according to the embodiment (Expression (2) and Expression (3)), when the intensity of interference of red is relatively smaller than the intensities of interference of blue and green, the light emission quantity of the pixel for red is increased using the technique described in the first example or the second example, and a reduction in the light emission intensity is suppressed, so that it is possible to implement a display device that a balance is achieved among the light emission intensities of R, G, and B colors, or it is possible to implement a display device that the power consumption is low and the lifetime is long.

It is noted that it may be fine that the display devices according to the embodiment and the examples described so far are provided with a so-called circular polarizer formed of a polarizer and a quarter wavelength film for a scheme of suppressing the reflection of natural light. The circular polarizer is disposed on the observer side of the transparent substrate for a bottom emission display, and is disposed on the observer side of the transparent sealing member for a top emission display. In the OLED display including a circular polarizer, the reflection of natural light caused by lines, a reflecting electrode, or the like can be reduced because of the effect of the circular polarizer, so that it is possible to implement a high contrast ratio under a bright environment.

Moreover, the configuration of the pixels forming the display unit of the display device may be any configurations such as a stripe configuration, a mosaic configuration, and a delta configuration, and it may be fine to select an appropriate configuration as matched with the specifications of a display device.

As described above, the disclosure made by the inventor is described specifically based on the embodiment and the examples. However, it is without saying that the present disclosure is not limited to the embodiment and the examples and can be variously modified.

What is claimed is:

1. A display device comprising a pixel including:
   a light emitting element;
   a driver element configured to control light emission of the light emitting element;
   a control element configured to control the driver element;
   a storage capacitor; and
   a pixel capacitor,
   wherein: a plurality of the pixels is formed in a matrix configuration;
   the plurality of the pixels includes a plurality of red pixels;
   the light emitting element is a white organic light-emitting diode element;
   a stacked film configuring the light emitting element is configured to have a wavelength in which a peak wavelength of an intensity of interference is shorter than a wavelength range corresponding to red, and
   a light emission intensity of the light emitting element corresponding to the red pixel is made greater than light emission intensities of the light emitting elements corresponding to pixels for other colors.

2. The display device according to claim 1, wherein the stacked film is configured to have a peak wavelength of an intensity of interference at a peak wavelength of a light emission intensity corresponding to blue or less.

3. The display device according to claim 1,
wherein when a wavelength at which an intensity of interference in light emitted from a light emitting layer configuring the light emitting element takes a maximum value at a viewing angle of zero degree is defined as λimax, a wavelength at which an intensity of interference takes a minimum value is defined as λimin, and a shortest wavelength at which an intensity of light emitted from the light emitting layer takes a maximum value is defined as λemax, relationships are satisfied:

λemax−50 nm≤λimax<λemax

λemax+200 nm≤λimin.

4. The display device according to claim 1, wherein a maximum value of an electric current enabled to be carried through the light emitting element corresponding to the red pixel is made greater than a maximum value of an electric current enabled to be carried through the light emitting elements corresponding to pixels for other colors.

5. The display device according to claim 4,
wherein: the plurality of the pixels includes a plurality of green pixels, a plurality of blue pixels, and a plurality of white pixels as well as the plurality of red pixels; and
when a channel width of a thin film transistor configuring the driver element of the red pixel is defined as $W_R$, a channel length is defined as $L_R$, a channel width of a thin film transistor configuring the driver element of the green pixel is defined as $W_G$, a channel length is defined as $L_G$, a channel width of a thin film transistor configuring the driver element of the blue pixel is defined as $W_B$, a channel length is defined as $L_B$, a channel width of a thin film transistor configuring the driver element of the white pixel is defined as $W_W$, and a channel length is defined as $L_W$, relationships are satisfied:

$W_R/L_R > W_G/L_G$ $W_R/L_R > W_B/L_B$ $W_R/L_R > W_W/L_W$.

6. The display device according to claim 4,
wherein: the plurality of the pixels includes a plurality of green pixels, a plurality of blue pixels, and a plurality of white pixels as well as the plurality of red pixels; and
when a storage capacitance of the red pixel is defined as $C1_R$, a pixel capacitance is defined as $C2_R$, a storage capacitance of the green pixel is defined as $C1_G$, a pixel capacitance is defined as $C2_G$, a storage capacitance of the blue pixel is defined as $C1_B$, a pixel capacitance is defined as $C2_B$, a storage capacitance of the white pixel is defined as $C1_W$, and a pixel capacitance is defined as $C2_W$, relationships are satisfied:

$C1_R/(C1_R+C2_R) < C1_G/(C1_G+C2_G)$ $C1_R/(C1_R+C2_R) < C1_B/(C1_B+C2_B)$ $C1_R/(C1_R+C2_R) < C1_W/(C1_W+C2_W)$.

7. The display device according to claim 1, wherein light is extracted from an opposite side of a substrate on which the light emitting element is formed.

8. The display device according to claim 1, wherein a light emission area of the light emitting element corresponding to the red pixel is made greater than light emission areas of the light emitting elements' corresponding to pixels for other colors.

9. The display device according to claim 8,
wherein: the plurality of the pixels includes a plurality of green pixels, a plurality of blue pixels, and a plurality of white pixels as well as the plurality of red pixels, and
when light emission areas of the pixels defined by an insulating film formed on a peripheral part of an electrode configuring the organic light-emitting diode element are defined as AR in the red pixel, AG in the green pixel, AB in the blue pixel, and AW in the white pixel, relationships are satisfied:

AR>AG

AR>AB

AR>AW.

10. The display device according to claim 9, wherein the electrode configuring the organic light-emitting diode element is formed on the substrate side on which the light emitting element is formed with respect to the stacked film.

11. A display device comprising a plurality of pixels, the plurality of pixels including:
a white organic light-emitting diode element;
a driver element configured to control light emission of the white organic light-emitting diode element; and
a control element configured to control the driver element,
wherein: light is extracted from an opposite side of a substrate on which the white organic light-emitting diode element is formed;
the pixels includes a plurality of red pixels;
when a wavelength at which an intensity of interference in light emitted from a light emitting layer configuring the white organic light-emitting diode element takes a maximum value at a viewing angle of zero degree is defined as λimax, a relationship λimax<600 nm is satisfied; and
a light emission intensity of the white organic light-emitting diode element corresponding to the red pixel is made greater than light emission intensities of the white organic light-emitting diode elements corresponding to pixels for other colors.

12. A display device comprising a plurality of pixels, the plurality of pixels including:
a white organic light-emitting diode element;
a driver element configured to control light emission of the white organic light-emitting diode element; and
a control element configured to control the driver element,
wherein: light is extracted from an opposite side of a substrate on which the white organic light-emitting diode element is formed;
the plurality of pixels includes a plurality of red pixels;
when a wavelength at which an intensity of interference in light emitted from a light emitting layer configuring the white organic light-emitting diode element takes a maximum value at a viewing angle of zero degree is defined as λimax, a wavelength at which an intensity of interference takes a minimum value is defined as λimin, and a wavelength at which an intensity of light emitted from the light emitting layer takes a maximum value is defined as λemax, relationships are satisfied, λemax−50 nm≤λimax<λemax λemax+200 nm≤λimin; and a light emission intensity of the white organic light-emitting diode element corresponding to the red pixel is made greater than light emission intensities of the white organic light-emitting diode elements corresponding to pixels for other colors.

13. The display device according to claim 12, wherein a relationship $\lambda \text{imax} < 600$ nm is satisfied.

14. The display device according to claim 11, wherein a maximum value of an electric current enabled to be carried through the white organic light-emitting diode element corresponding to the red pixel is made greater than a maximum value of an electric current enabled to be carried through the white organic light-emitting diode elements corresponding to pixels for other colors.

15. The display device according to claim 11, wherein a light emission area of the white organic light-emitting diode element corresponding to the red pixel is made greater than light emission areas of the white organic light-emitting diode elements corresponding to pixels for other colors.

* * * * *